United States Patent [19]

Fedde et al.

[11] 4,454,539
[45] Jun. 12, 1984

[54] AUTOMATIC LEVEL CONTROL CIRCUITRY

[75] Inventors: George A. Fedde, Perkiomenville; Juan M. Gottschalk, Elkins Park, both of

[73] Assignee: Sperry Corporation, New York, N.Y.

[21] Appl. No.: 342,980

[22] Filed: Jan. 26, 1982

[51] Int. Cl.³ .............................................. H04N 7/18
[52] U.S. Cl. .............................. 358/106; 250/363 S; 356/448; 358/282; 358/293
[58] Field of Search ............... 358/101, 106, 107, 160, 358/168, 169, 280, 282, 284, 293; 250/337, 361, 363 R, 363 S, 368, 369, 458, 462, 483, 484; 356/448

[56] References Cited

U.S. PATENT DOCUMENTS

| 4,152,723 | 5/1979 | McMahon | 358/106 |
| 4,318,129 | 3/1982 | Zwirn | 358/169 |
| 4,399,469 | 8/1983 | Lew | 358/282 |

Primary Examiner—Howard W. Britton
Attorney, Agent, or Firm—Marshall M. Truex; James R. Bell

[57] ABSTRACT

A scanning apparatus periodically sweeps a beam of light across a printed circuit board in a plurality of sweep paths. An associated detector is responsive to radiation from the printed circuit board for producing first and second signals indicating whether a conductor portion or substrate portion of the board is being swept. An associated automatic level control is responsive to the first and second signals for providing level adjusted output signals. The levels of the adjusted output signals are substantially the same for all printed circuit boards swept in the scanning apparatus.

19 Claims, 6 Drawing Figures

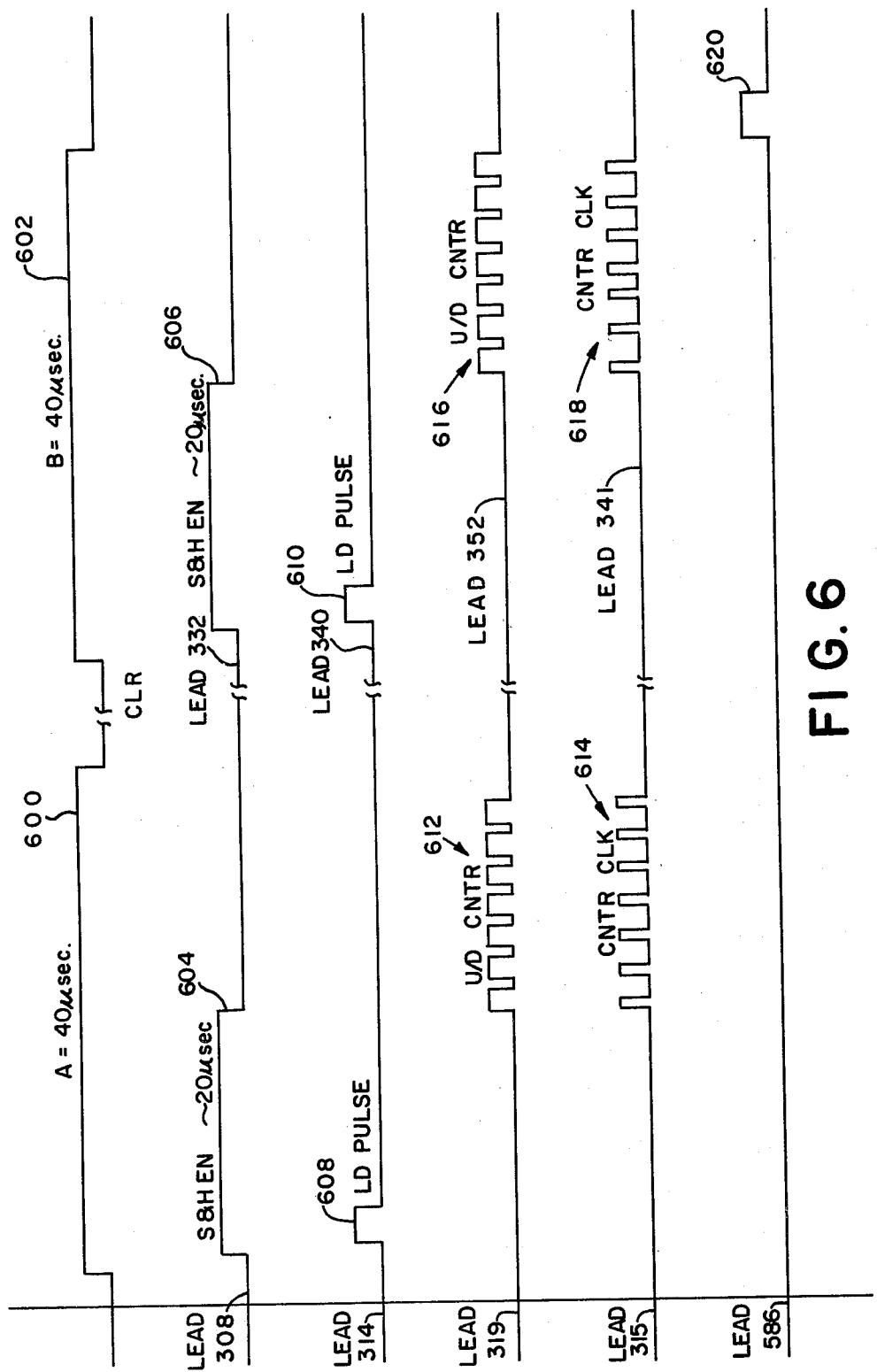

AUTOMATIC LEVEL CONTROL CIRCUITRY

This application is related to the copending application of Kenneth H. Kirk, et al, Ser. No. 342,981, entitled Automatic Level Control Circuit, and filed concurrently herewith.

BACKGROUND OF THE INVENTION

This invention relates to a circuit for automatically controlling the signal level of first and second signals, particularly, first and second signals representative of a binary image of a target surface where the image is generated by a light beam scanning apparatus.

Equipment exists for automatic inspection of printed circuit boards which boards comprise a pattern of metallic conductors on a non-conducting or insulating substrate. In such equipment, a scanning light beam, such as a laser beam, periodically sweeps across the surface of the printed circuit board, and a detector assembly portion of the equipment detects the response of various portions of the surface to the impinging laser beam. For example, in U.S. Pat. No. 4,152,723, which is hereby incorporated by reference as if specifically set forth herein, when a scanning laser beam impinges on the substrate, it excites "a detectable fluorescence in the surface of the insulating substrate" which is "detected by means sensitive to the wavelength of the fluorescence." The detector means generates first and second signals depending on the absence or presence of fluorescence in the yellow-red wavelength range which first and second signals represent the presence of conductor or substrate. When the first and second signals are digitized and synchronized with the scanning of the laser beam, a binary image of the pattern of the conductors on the substrate is provided. In order to form an accurate binary image, signals from the detector portion representing conductor (for example first signals) and signals from the detector portion representing substrate (for example second signals) must be distinguished from one another and identified as first or second signals for each printed circuit board inspected by the apparatus. However, different printed circuit boards having different conductor and substrate characteristics generate varying signal levels for the first and second signals from one printed circuit board to the next. For example, the substrate in one printed circuit board may fluoresce more or less than the substrate from a different manufacturer in a second printed circuit board. Also, the reflected light characteristics from the conductors on a first printed circuit board and their effect on the detector output may differ from the reflected light characteristics from the conductors on a second printed circuit board. Therefore, it is necessary to provide a method and apparatus for automatically controlling the level of first and second signals received from the detector portion to insure that signals representing conductor and signals representing substrate will be identified and digitized as such to provide an accurate binary signal image of the printed circuit board.

SUMMARY OF THE INVENTION

A detector assembly portion of a scanning apparatus generates signals having first and second signal levels in response to a light beam which periodically sweeps a pattern of metallic conductors on an insulating substrate of a printed circuit board. The signals are associated with the interaction of the light beam with either the metallic conductors or the substrate. In the preferred embodiment, where the scanning apparatus with which the detector is associated is of the type described in U.S. Pat. No. 4,152,723, the signals with first signal levels are associated with the conductors (conductor signals). They have a lower signal level than signals with second signal levels associated with the substrate (substrate signals).

An object of the present invention is directed to a method and apparatus for automatically producing adjusted output signals associated with the first and second signals and having values adjusted to signal values which values are nearly the same for all printed circuit boards of differing reflecting characteristics.

Another object of the present invention is to provide a method and apparatus as described above for producing summed first and second signals where said summed first signal has a level substantially equal to zero.

A further object of the present invention is to provide a method and apparatus as described above for producing level adjusted first and second output signals in response to said summed first and second signals.

An object of the present invention is to provide an automatic level control circuit and method capable of adjusting the absolute level of a first reference signal to equal substantially the absolute level of the first signals during a first predetermined time interval, summing the adjusted first reference signal with the first and second signals to produce summed output signals, operating on summed substrate output signals with a second reference signal during a second predetermined time interval and comparing the result with a preselected value, adjusting the value of the second reference signal in response to the comparison such that operation on summed substrate output signals with the adjusted second reference signal produces signals with values substantially the same as the preselected value.

A further object of the present invention is to provide an automatic level control circuit as described above including means for generating a first reference signal and means for providing a sample signal having a signal level representative of the signal level of first signals provided by the detector assembly during a first time interval when only first signals are produced by the detector assembly, the automatic level control circuit further capable of comparing the signal levels of the first reference signal and the sample signal and changing the level of the first reference signal to equal the sample signal level.

Another object of the present invention is to provide a method of automatically producing adjusted output signals as described above, the method including forming first and second signal calibration strips on a printed circuit board being scanned whereby only first signals are generated during the first time interval and second signals during the second time interval.

Another object of the present invention is to provide an automatic level control circuit as described above including means for generating a second reference signal and means for providing a sample signal having a signal level representative of the signal levels of second signals produced by the detector assembly during a second time interval when only second signals are produced by the detector assembly, the automatic level control circuit further capable of comparing the signal levels of the second reference signal and the sample signal and changing the level of the second reference signal to equal the sample signal level during the second time interval.

A further object of the present invention is to provide an automatic level control circuit as described above including operating means for multiplying the sample signal of the second signals by the second reference signal during the second time interval and multiplying second signals from the detector assembly by the adjusted second reference signal thereafter.

Other objects, features and advantages of the present invention will become more fully apparent from the following detailed description of the preferred embodiment, the appended claims and the accompanying drawings in which:

BRIEF DESCRIPTION OF THE DRAWINGS

FIG. 6 is a waveform diagram illustrating timing signals used in the operation of the present invention.

DETAILED DESCRIPTION OF THE INVENTION

Figure 1:
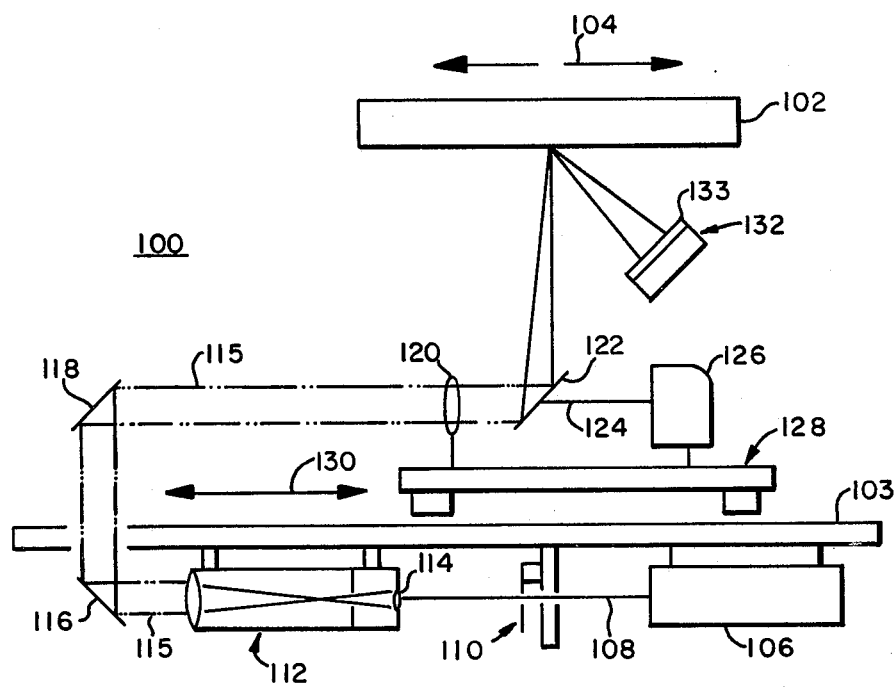
FIG. 1 is a schematic illustration of a scanning apparatus suitable for use with the present invention.
Figure 2:
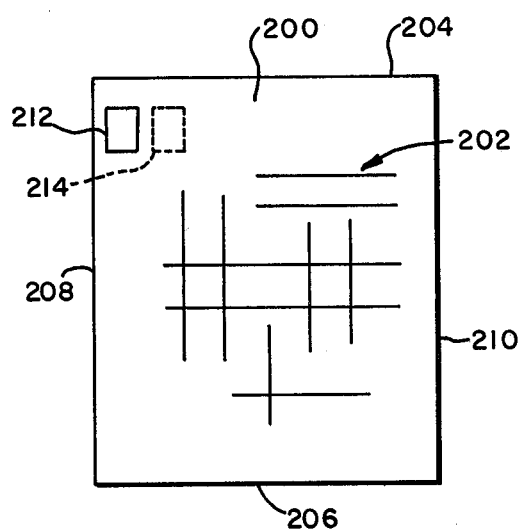
FIG. 2 illustrates a test specimen suitable for use with the scanning apparatus of FIG. 1.

FIG. 1 is a preferred embodiment block diagram schematic of an optical scanning system designated generally 100 suitable for use with the present invention. A portion of a printed circuit board (FIG. 2) hereinafter referred to as a PCB comprises a pattern of metallic conductors designated generally 202. The PCB is mounted in a precision PCB holder 102 (FIG. 1). The holder 102 is a portion of a cylinder forming a partial, right circular cylindrical inner surface. The printed circuit board is held on this inner surface. The holder 102 is mounted above a planar main support table 103 of the apparatus with the axis of the cylinder lying parallel to the line and arrows 104 and the plane of the table 103. When mounted in the holder 102 the surface and parallel edges 204 and 206 of PCB 200 are curved to conform to the cylindrical inner surface of holder 102. Parallel edges 208 and 210 extend in a direction parallel to axis 104. It should be noted that the cylindrically shaped holder represents a preferred embodiment geometrical shape but other shapes could be employed in a scanning system used with the present invention. For example, PCB 200 could be mounted on a flat surface.

The scanning apparatus further comprises a laser beam light source 106 attached to the underside of table 103 which light source transmits a beam 108 to a safety shutter structure designated generally 110 also mounted to the underside of table 103. The shutter structure blocks the beam if a safety interlock (not shown) in the system is activated. Originally the beam has a $1/e^2$ diameter of 1 millimeter, where $e = 2.71828$.

After passing through the shutter structure 110, the beam enters a beam expander designated generally 112 (attached to the underside of the table 103) where it is spatially filtered through a 10 micron aperture 114 and has its diameter increased to 32 millimeters. The expanded beam is designated 115. Two 75 millimeter diameter, one tenth wave length front surface mirrors 116 and 118 are used in a periscope arrangement to feed the beam 115 from below the table to above the table where it follows a path along the axis of a spot imaging lens 120. After passing through the lens 120 the beam 115 impinges on a scanning mirror 122.

The scanning mirror 122 is mounted at a 45° angle on the center line axis of the laser beam 115. It is attached to a shaft 124 of an angular encoder 126 and is rotated thereby. The encoder with shaft and scanning mirror are mounted to a Y-axis translate table 128 which table is disposed to move along the direction of line and arrows 130, parallel to line and arrows 104. The beam 115 is reflected from mirror 122 and is focused to a small light beam on the surface of the printed circuit board 210 on the inner surface of holder 102. In the preferred embodiment, the $1/e^2$ cross section of the beam as it impinges on the PCB has a 0.001 inch diameter.

As the mirror 122 rotates it causes the laser beam to sweep across the PCB from one parallel edge to the other (for example, from edge 208 to edge 210). At the same time, the Y-axis translate table 128 is caused to move along the direction of line and arrows 130 at a slow rate. In the preferred embodiment, the Y-axis table 128 advances one thousandth of an inch per scanning mirror revolution.

In the preferred embodiment, the light source is a helium-cadmium laser which generates a blue light. When the blue laser light (0.001 inch diameter with 10 milliwatts of power) impinges on the substrate of the PCB in the holder, the substrate fluoresces producing light in the yellow-red wave length. When the beam falls upon a conductor, blue light is emitted therefrom but yellow-red light is not present.

The fluorescent yellow-red signal from the scanning spot is detected by a plurality of photomultiplier tubes (PMT) designated generally 132 in FIG. 1. Each PMT is equipped with a filter 133 designed to pass only yellow-red light. In the preferred embodiment, there are eight PMTs arrayed in an arc, positioned off the perpendicular to the axis of the cylindrical holder 102 in order to avoid direct specular reflection from the PCB. The PMTs are mounted on the Y-axis table 128. The simultaneous output of all PMTs is summed in an amplifier and fed to the circuitry of the present invention.

Before describing the circuitry of the present invention the operating characteristics of the PMTs will be described. The modern PMT is a solid state device that converts light quanta into electron current. A typical PMT suitable for use in the present invention is an EMI extended range S5, type 9781R. Typical currents provided by the PMT anodes are as follows:

dark current (no light on PMT)—$1 \times 10^{-8}$ amps
laser spot on metal—$1 \times 10^{-6}$ amps
laser spot on substrate—$1 \times 10^{-5}$ amps Ideally, the PMT anode current for the laser beam on metal would be equal to the dark current. However, it is much larger than the dark current because blue light emitted from the PCB, attenuated about 5,000:1 by filter 133, is still a significant signal. In addition, the yellow glass filter also fluoresces slightly when excited by the reflected blue light.

Using the above anode current definitions, a fluorescent conversion efficiency ratio, R, for a PCB is defined as $$R = \frac{S1}{S2} = \frac{\text{Anode current, laser beam on substrate}}{\text{Anode current, laser beam on conductor}}$$

R will not necessarily be the same value for all PCBs inspected. For example, in a group of 55 samples of PCBs, R varied from 6 to 30. Larger values of R mean that fewer digitizing errors will be made in detecting the location of the change from metal to substrate and vice versa on a PCB.

In order to determine at a particular instant in time (or at a particular position of the laser beam during a sweep) whether the laser is impinging on metallic conductor or substrate it is necessary to establish a digitizing threshold level between S1 and S2. Anode current below the threshold level is taken to mean that the laser is illuminating a metallic surface while anode current above the threshold level is taken to mean that the laser is illuminating substrate. Some errors will occur in this process and selection of the threshold level will determine the error rate for a given value of R. It is desirable to preselect a threshold level for the system which level remains fixed for all PCBs inspected. However, since R varies among PCBs, the threshold level for an acceptable error rate will also vary. The Automatic Level Control (ALC) circuit of the present invention overcomes this problem by providing substrate and conductor output signals associated with the anode signals for substrate and conductor respectively which output signals have the same value for all PCBs. An effective R, formed by the ratio of the substrate to conductor output signals, thus remains constant for all PCBs.

In the preferred embodiment, when the PCB 200 is mounted in the holder 102, the laser beam sweeps from edge 208 to edge 210 in a series of substantially parallel sweeps. The first sweep begins adjacent and parallel to edge 204 with succeeding sweeps being closer to edge 206 as the Y-axis table moves continuously from left to right along line and arrows 130.

The surface of PCB 200 includes a first area or calibration strip 212 and an adjacent but spaced apart second area or calibration strip 214. Calibration strip 212 comprises a rectangular metallic surface composed of the same material as the metallic surface making up the pattern 202. The calibration strip 214 comprises substrate of the PCB which is composed of the same material as the substrate surrounding the metallic conductor pattern 202. It will be understood that calibration strip 214 may be merely a specifically defined area of the substrate PCB 200. The calibration strips or areas 212 and 214 are formed during the PCB manufacturing process and they serve as calibration strips for use with the circuitry of the present invention as subsequently described.

After the PCB 200 is securely mounted in holder 102, a start command is initiated and the scanning apparatus enters a slew mode. In this mode, the Y-axis table 128 moves to a predetermined location along line and arrows 130. Then a second start command is initiated and the scanning apparatus begins a scan mode. The first sweep of the laser beam during the scan mode follows a path across the calibration strips 212 and 214.

Angular encoder 126 generates a zero reference signal before each start of scan of the laser beam across the PCB 200. With each zero reference signal counters in a control signal generator 302 (FIG. 3) are reset and counting of clock signals starts over. Forty microsecond pulses A and B are generated by generator 302 which correspond in time to the movement of the laser beam across the calibration strips 212 and 214. The calibration strips are located at predetermined spots on the PCB and the counters in generator 302 count from the zero reference signal, which occurs at a known location ahead of the PCB 200, to the calibration strip 212. The A pulse then begins and continues until the counter reaches a count corresponding to the time it takes the laser beam to cross the strip 212. In a similar way the B pulse is generated.

The A and B pulses are generated with each laser sweep after a zero reference signal. The A and B pulses are required for generation of the control signals (FIG. 6) generated by control signal generator 302 for operation of the circuits of the present invention. However, the A and B pulses are enabled for purposes of distributing the control signals to other parts of the ALC circuit only during the first sweep after the start command in the scan mode. With this second start signal the Y-axis table begins to move and inspection of the board begins after the single sweep of the calibration strips 212 and 214 during which the A and B pulses are enabled. The A and B pulses are not enabled again until the start command is given at the end of the slew mode for the next PCB to be inspected.

All control signals in FIG. 6 are synchronous with a clock signal 304 which clock signal is also used to sample the output of the ALC curcuit during the laser scan. The control signals are derived from a PROM (not shown) within circuit 302. Two counters, stepped by the clock signal within the A and B intervals, generate addresses for reading the control signals from the PROM. Each of the PROM outputs is latched for the duration of one clock period.

Referring now to FIG. 6, during the time that the laser beam is crossing conductor strip 212, the control signal generator 302 generates an A signal 600 having a first predetermined time interval corresponding to the time that it takes the laser beam to cross the strip 212. (In the preferred embodiment, this is approximately 107 master clock pulses or 40 microseconds). After a short time interval corresponding to the space between the calibration strips 212 and 214, the laser beam sweeps across the calibration strip 214 and circuit 302 generates a second timing signal, B signal 602, during a second predetermined time interval corresponding to the time it takes the laser beam to sweep across calibration strip 214. (Similarly, the second predetermined time interval is 107 clock pulses or 40 microseconds).

During the first half of both the A and B pulses, the control signal generator 302 generates sample and hold enable signals 604 and 606 (FIG. 6). The sample and hold enable signals are slightly less than 20 microseconds in duration, terminating at or just before the mid points of the A and B signals respectively. The control signal generator 302 also generates load pulses 608 and 610. They are approximately 3 microseconds in duration in the preferred embodiment and start one clock pulse after the start of the sample and hold signals 604 and 606.

During the latter half (last 20 microseconds) of the A signal, generator 302 generates a first series of up/down counter signals designated generally 612 and a first series of counter clock signals designated generally 614. For every up/down counter signal in the series 612 there is an associated simultaneously occurring counter clock signal. Each counter clock signal has a narrower pulse width than its associated up/down counter signal, and each counter clock signal occurs within the time period of each up/down counter signal. In the preferred embodiment, there are seven signals in each of the series 612 and 614. In a similar fashion, during the latter half (last 20 microseconds) of the B signal, generator 302 generates a second series of up/down counter signals designated generally 616 and a corresponding second series of counter clock signals designated generally 618.

The operation of FIG. 3 will be described in connection with the time intervals associated with the A and B signals 600 and 602. In general, the photomultiplier tube assembly 132 generates anode current signals associated with reflections of the laser light from conducting elements on the printed circuit board or anode current signals associated with fluorescence of the substrate when the substrate is illuminated by the laser light. These signals will be referred to hereinafter as conductor signals and substrate signals, respectively. During the A signal interval the laser light impinges on the calibration conducting strip 212 and the photomultiplier tube assembly 132 generates and transmits a signal hereinafter referred to as a calibration conductor signal. When the laser beam passes across the substrate calibration strip 214, the photomultiplier tube assembly 132 generates and transmits a signal hereinafter referred to as a calibration substrate signal. Remember the A and B pulses are generated by the control signal generator 302 to correspond to movement of the laser beam across the strips 212 and 214, respectively.

During interval A, the calibration conductor signal is transmitted via lead 303 to a first sample and hold circuit designated generally 306. The first sample and hold circuit 306 is enabled to receive the calibration conductor signal during the first half (approximately 20 microseconds) of the A signal in response to the sample and hold enable signal 604 transmitted via lead 308 from the control signal generator 302. At the end of the sample and hold enable signal 604, the first sample and hold circuit 306 transmits a sample of the calibration conductor signal via lead 310 to a first comparator circuit 312.

Also during time interval A, a first reference means designated generally 316 generates a first reference signal in response to load signal 608 received from control signal generator 302 via lead 314. The first reference signal is transmitted via lead 318 to the first comparator circuit 312. Comparator circuit 312 compares the levels of the sample of the calibrated conductor signal on lead 310 and the first reference signal on lead 318 and generates a correction signal in response thereto. During the latter half of the A time interval, control signal generator 302 transmits the up/down counter signals 612 to the first comparator circuit 312 over lead 319 and transmits the counter clock signals 614 to the first reference means 316 over lead 315. With each up/down counter signal received, the first comparator circuit 312 transmits a correction signal via lead 320 to the first reference means 316. During the time that an up/down signal 612 is present on lead 319, first reference means 316 receives a counter clock signal. In response thereto, the first reference means adjusts the level of the first reference signal on lead 318 in accordance with the state of the correction signal on lead 320. In response to the new level of the first reference signal on lead 318, the comparator circuit 312 makes a new comparison between the level of the first reference signal and the sample of the calibrated conductor signal on lead 310. Then, with the next up/down counter signal, the comparator 312 transmits a new correction signal on lead 320 to circuit 316 which in turn adjusts the level of the first reference signal upon arrival of a counter clock signal on lead 315. This continues for the remainder of the time interval A while the series of up/down counter signals 612 and counter clock signals 614 are transmitted from the control signal generating circuit 302.

The action of the comparator circuit 312 during the latter part of the time interval A causes the level of the first reference signal to match within the quantization error the level of the sample of the calibrated conductor signal. At the end of the time interval A, the adjustment of the level of the first reference signal ceases and a fixed level first reference signal is available via lead 322 to a summing circuit designated generally 324.

During the time interval B (signal 602), the laser beam is crossing the substrate calibration strip 214. Accordingly, the photomultiplier tube assembly 132 transmits the calibration substrate signal via lead 326 to a second input terminal of the summing circuit 324. Summing circuit 324 provides a summed output signal associated with the calibration substrate signal over lead 328 to the second sample and hold circuit designated generally 330. The summed output signal present on lead 328 is a sum of the calibration substrate signal on lead 326 and the fixed level first reference signal on lead 322.

The second sample and hold circuit 330 is enabled to receive the summed calibration substrate signal during the first half (approximately 20 microseconds) of the B signal in response to the sample and hold enable signal 606 transmitted via lead 332 from control signal generator 302. At the end of the sample and hold enable signal, the second sample circuit 330 transmits a sample of the summed calibration substrate signal via lead 333 to a switch 334. During the B time interval, the switch 334 transmits the summed calibration substrate signal over lead 336 to a first input terminal of an operating means designated generally 338.

During time interval B, a second reference means designated generally 342 generates a second reference signal in response to load signal 610 received from control signal generator 302 over lead 340. The second reference signal is transmitted via lead 344 to a second input terminal of operating means 338. Operating means 338 in the preferred embodiment multiplies the summed calibration substrate signal on lead 336 by the second reference signal present on line 344 and then divides the product by ten. The resultant signal is applied to a second comparator circuit 339 along with a fixed signal having a predetermined signal value. The resultant signal is compared with the fixed signal having a predetermined output value and a correction signal is generated in response thereto. During the latter half of the B time interval, control signal generator 302 transmits the up/down counter signals 616 to the second comparator circuit 339 over lead 352 and transmits the counter clock signals 618 to the second reference means 342 over lead 341. With each up/down counter signal received, the second comparator circuit 339 transmits a correction signal via lead 350 to the second reference means 342. During the time that an up/down signal 616 is present on lead 352, second reference means 342 receives a counter clock signal. In response thereto, the second reference means 342 adjusts the level of the second reference signal in accordance with the state of the correction signal on lead 350. In response to the new level of the second reference signal on lead 344, the operating means 338 operates on the new level of the second reference signal and on the sample of calibration substrate signal present on lead 336. Then, with the next up/down counter signal, the second comparator circuit transmits a new correction signal on lead 350 to second reference means 342 which in turn adjusts the level of the second reference signal upon arrival of a counter clock signal on lead 341. This continues for the remainder of the time interval B while the series of up/down counter signals 616 and counter clock signals 618 are transmitted from the control signal generating circuit 302.

The operation of the operating means 338 and second comparator circuit 339 during the latter part of the time interval B causes the level of the second reference signal to match within the quantization error the predetermined output value of the fixed signal being applied to the second comparator circuit 339. At the end of the time interval B, the adjustment of the level of the second reference signal ceases and a fixed level second reference signal is available via line 334 to the operating circuitry means 338.

After the first laser beam sweep in the scan mode, the laser scans the printed circuit board. Photomultiplier tube assembly 132 transmits a plurality of mixed conductor and substrate signals in response to the scanning of the printed circuit board. These signals are transmitted via lead 326 to the summing circuit 324 where they are summed with the fixed level first reference signal on lead 322. The result is a series of summed output signals comprising summed conductor signals and summed substrate signals transmitted via lead 354 to the switch 334.

When the B signal 602 goes low in line 335, the switch 334 switches and transmits the summed conductor and substrate signals via lead 336 to the operating means 338. The operating means operates on the summed conductor and substrate signals and the fixed level second reference signal with the same operation it performed on its input signals during the B time interval. When summed substrate signals are present on lead 336, the operating means provides adjusted value substrate signals having a value close to the predetermined signal value of the fixed signal being applied to the second comparator circuit. When summed conducting signals are present on lead 336, adjusted conductor signals are provided which have a value which is very small compared to the value of the adjusted substrate signal. This small value is preferably zero.

The adjusted conductor and substrate signals from operating means 338 are then transmitted via lead 570 to digitizing circuit designated generally 572 and to automatic error circuit designated generally 574. Digitizing circuit 572 transmits binary high and low signals over lead 590 to a preprocessing circuit not shown in response to the adjusted substrate and conductor signals, respectively. The preprocessing circuit operates on the binary signals to eliminate digitizing errors etc. The automatic error circuit 574 produces an error signal over lead 592 to alert the operator of the scanning apparatus when proper adjustment of the summed substrate signal during the B interval has not taken place.

By adjusting the first reference signal to provide a near zero summed output signal on lead 354 in response to conductor input signals on lead 326, and by adjusting the second reference signal to cause the operating means 338 to provide adjusted substrate signals with a value close to the predetermined signal value of the fixed signal applied to the second comparator circuit 339 when summed substrate signals are present on lead 336, the circuit of the present invention overcomes the difficulties associated with inspecting circuit boards with varying characteristics.

Figure 3:
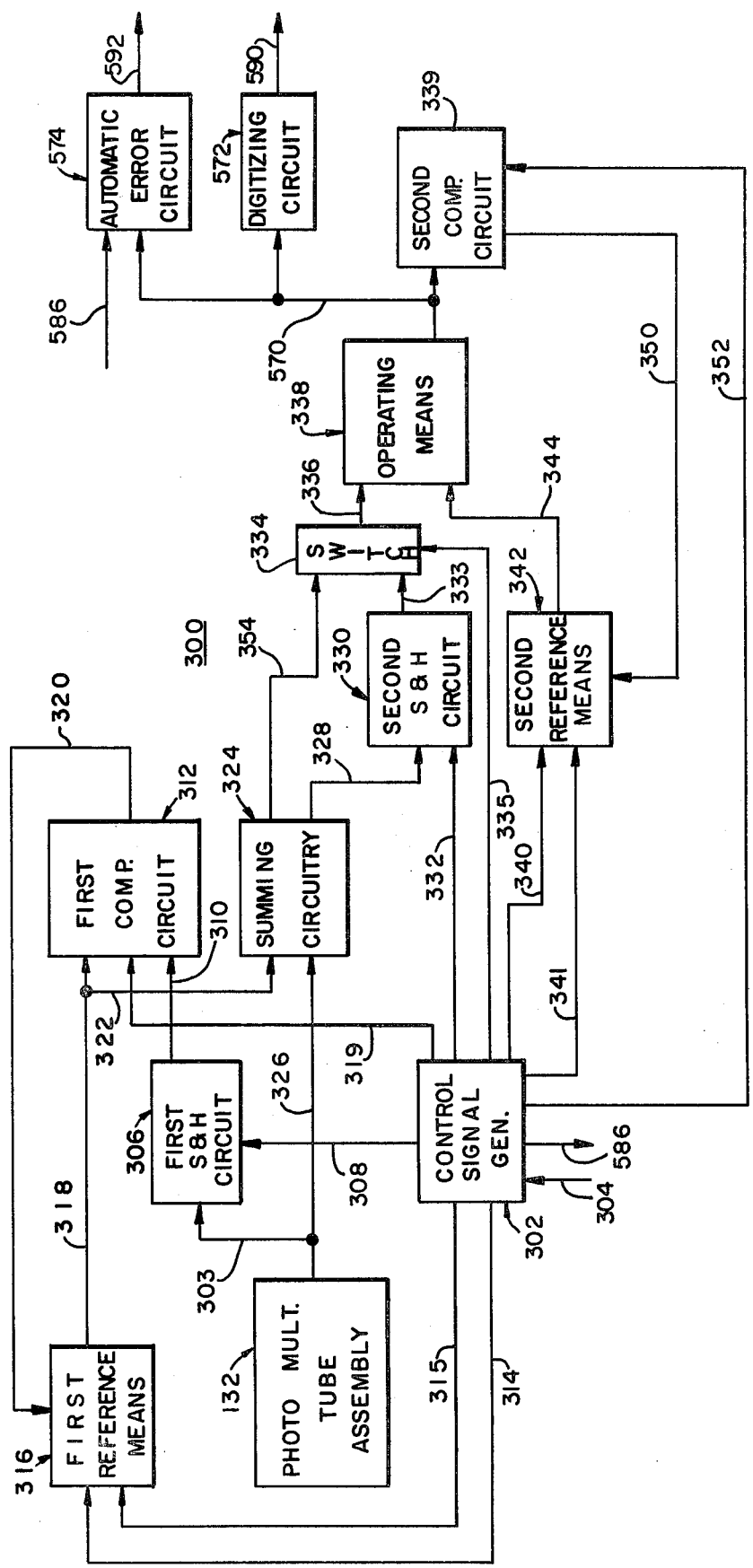
FIG. 3 is a block diagram of a preferred embodiment of the present invention.

In FIG. 3 the first reference means 316, the first sample and hold circuit 306, the first comparator circuit 312, and the summing circuit 324 comprise a first circuit means for producing summed first and second signals. The second sample and hold circuit 330, the operating means 338, the second reference means 342 and second comparator means 339 comprise a second circuit means responsive to the summed first and second signals to produce level adjusted first and second output signals.

Figure 4:
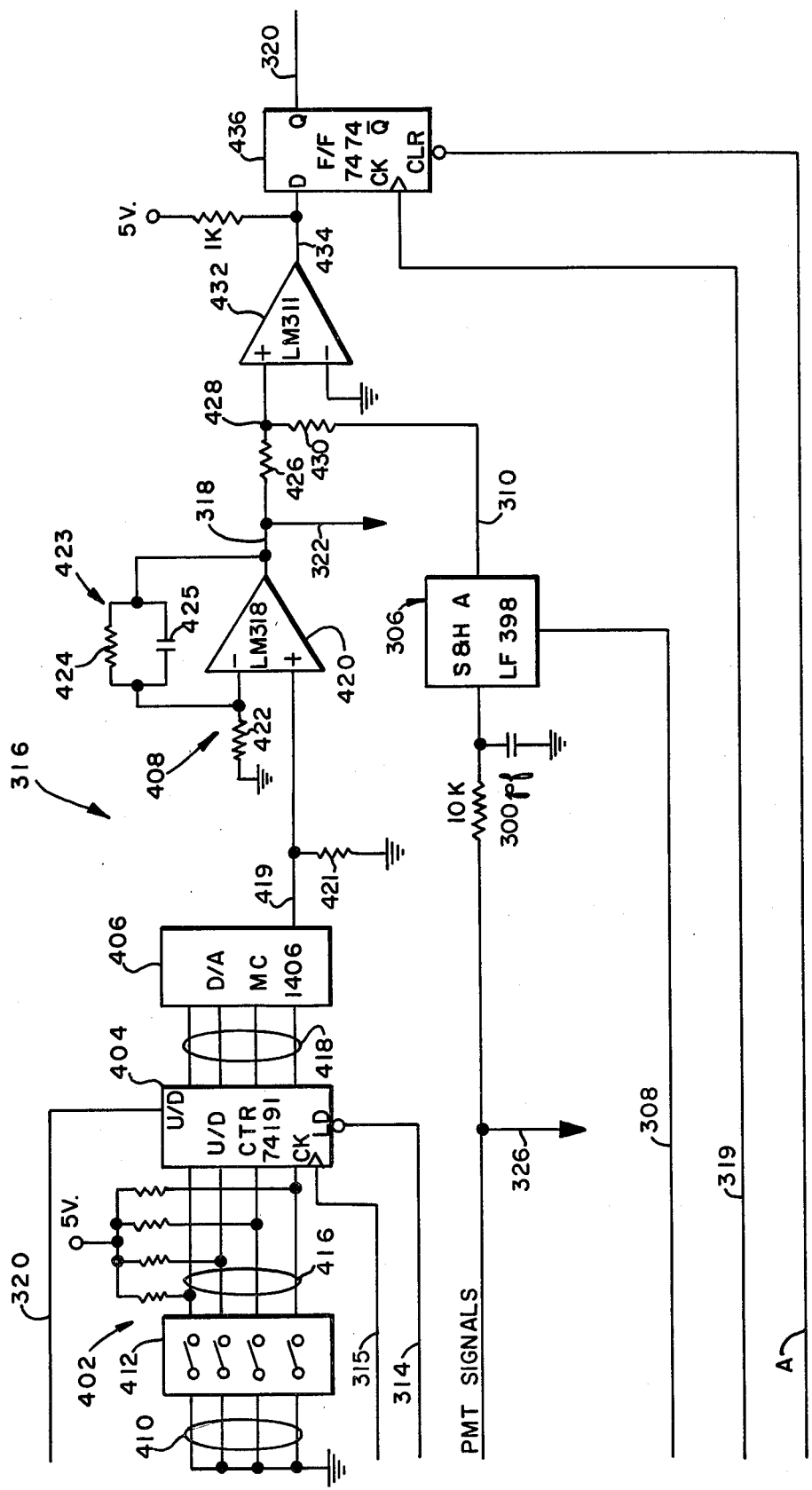
FIG. 4 is a more detailed block diagram of first reference means and first correction means portions of the block diagram of FIG. 3.

FIG. 4 illustrates in greater detail the first reference means 316, first comparator circuit 312 and first sample and hold circuit 306. The first reference circuit 316 comprises an initializing circuit designated generally 402, an up/down counter 404, a digital to analog (D/A) converter 406 and an amplifier circuit designated generally 408. The initializing circuit 402 has four parallel input leads 410 which are connected between ground and one side of four switches located within a switch assembly 412. It further comprises four parallel leads 416 connected to the other side of the switches in switch assembly 412. The four output leads 416 are connected through 1K resistors to a five volt power supply, and to four input terminals of the up/down counter 404. As long as the switches 412 are open, the four output leads 416 are in the high state and represent four high signals into up/down counter 404. If any of the switches are closed then the associated lead 416 is pulled down to the low state since the lead is then connected to ground through the closed switch. By manually selecting which of the switches in assembly 412 are open and which are closed, any one of sixteen different initial levels can be preselected for loading into the up/down counter circuit 404. In the preferred embodiment counter 404 is a 74191 TTL device.

Up/down counter 404 is connected via four parallel output leads 418 to the inputs of D/A converter 406. In the preferred embodiment, converter 406 is a Motorola MC 1406 device which generates and transmits a current signal over lead 419. The level of the current signal varies from zero to −2 milliamps depending on the level of the four bit input signal on leads 418. When the four input signals are all high, converter 406 provides a zero milliamp current signal. When the four input signals are all low, converter 406 provides a −2 milliamp signal.

The output of D/A converter 406 is connected via lead 419 to the amplifier circuit 408 which comprises an operational amplifier 420, a 100 ohm resistor 421 connecting lead 419 to ground, a 1K resistor 422 connected between ground and the inverting (negative) input terminal of operational amplifier 420, and a feedback circuit designated generally 423 including a 4.99K resistor 424 and a 5 pf capacitor 425 connected in parallel between the output of operational amplifier 420 and its inverting input. The negative current of the converter 406 through resistor 421 develops a negative input voltage to the noninverting input (positive) of operational amplifier 420. With the configuration of circuit 408 shown in FIG. 4 the output of D/A converter 406 is amplified by a factor of approximately 6 to 1. The output of amplifier circuit 408 on line 318 is a negative voltage called the first reference signal.

The first reference signal is transmitted through 1K resistor 426 to a junction 428. The other input to junction 428 is a positive voltage representing a sample of the calibration conductor signal transmitted from first sample and hold circuit 306 via lead 310 through a 1K resistor 430. First sample circuit 306 comprises a National Semiconductor LF398 sample and hold device. Junction 428 is connected to the noninverting input of voltage comparator 432. The inverting input of voltage comparator 432 is grounded. The output of comparator 432 is connected via lead 434 to the D input of a flip flop 436.

Resistors 426 and 430, comparator 432, and D flip flop 436 comprise first comparator circuit 312. The configuration of comparator circuit 312 in FIG. 4 represents a ground state comparator. In this configuration, the comparator 432 saturates when even a minute input voltage is present at the positive or noninverting terminal. If the value of the negative first reference signal through resistor 426 exceeds the value of the positive signal from the sample and hold circuit 306 through resistor 430 by even a small amount then a low binary signal is transmitted from amplifier 432 to D flip flop 436. If the signal from the sample and hold circuit 306 exceeds the value of the first reference signal by even a small amount then a high binary signal is provided to D flip flop 436.

The operation of the circuit of FIG. 4 will be described in connection with the signals of FIG. 6. During the first 20 microseconds of the A time interval, the load signal 608 is applied over lead 314 to the load input of counter 404 and loads the manually selected signal in initializing circuit 402 into the up/down counter 404. This four bit signal is converted to an analog signal by D/A converter 406, amplified by amplifier circuit 408 and transmitted to junction 428. During the same 20 microseconds, the photomultiplier tube assembly 132 transmits the calibration conductor signal to sample and hold circuit 306. The sample and hold enable signal 604 is applied via lead 308 to sample and hold circuit 306 to enable circuit 306 to form a signal representative of the calibration conductor signal. During the latter 20 microseconds of the time interval A, sample and hold circuit 306 transmits a representative sample of the calibration conductor signal to junction 428. Comparator 432 provides a positive or ground signal to D flip flop 436 depending on the relative levels of the sample calibration conductor signal and the first reference signal. Also, during the latter 20 microseconds of the A time interval, the series of up/down counter signals 612 are transmitted over lead 319 as clocking signals to D flip flop 436 and the series of synchronously occurring counter clock signals 614 are transmitted as clocking signals over lead 315 to the up/down counter 404.

Each time the D flip flop is clocked, either a high or low correction signal is transmitted via line 320 to the up/down input of counter 404. In response to a counter clock signal, the counter incrementally increases or decreases (depending on the level of the correction signal) the value of the four bit signal stored within counter 404. The new signal, either higher in value or lower, is converted to analog, amplified and compared with the level of the sample of the calibration conductor signal from sample and hold circuit 306 at junction 428. This provides a new input, either high or low, to D flip flop 436. The above process repeats with the occurrence of each new up/down counter signal and counter clock signal respectively. Eventually, the level of the first reference signal is adjusted within the quantization error to the level of the sample of the calibration conductor signal. After the A time interval is over the value of the first reference signal remains fixed throughout the remainder of the inspection of the printed circuit board. The trailing edge of the A pulse 600 clears flip flop 436.

Figure 5:
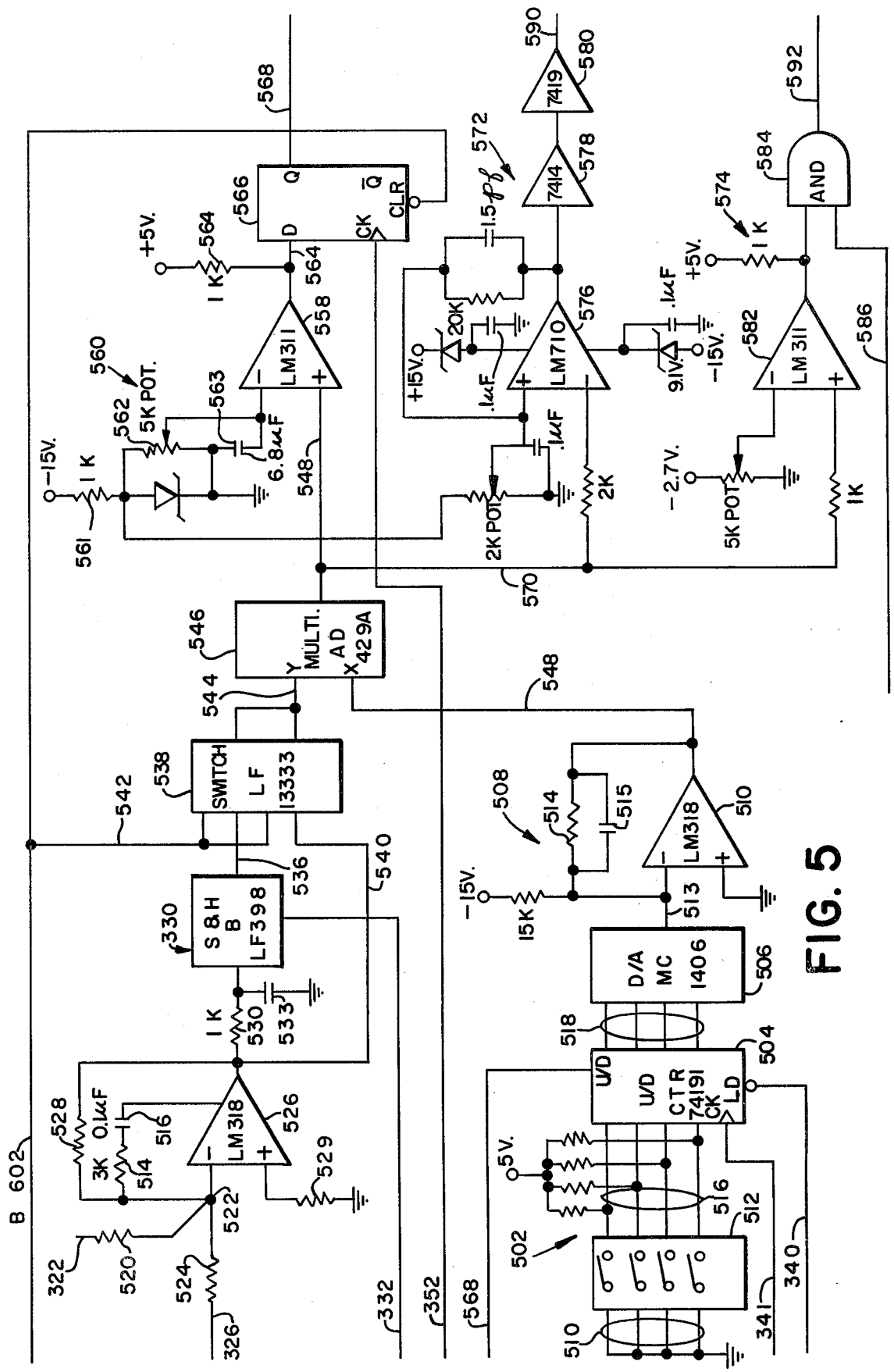
FIG. 5 is a more detailed block diagram of the summing means, second reference means, second correction means, operating means, digitizing means and fault indicator means portions of the preferred embodiment block diagram of FIG. 3.

FIG. 5 shows the details of FIG. 3, namely the summing circuit 324, second sample and hold circuit 330, second comparator circuit 339, operating means 338 and second reference means 342. The second reference means designated generally 342 (in FIG. 3) comprises the following in FIG. 5: initializing circuitry designated generally 502; an up/down counter 504; an A/D converter 506; and a current to voltage converter designated generally 508. The initializing circuitry 502 has four parallel input leads 510 which are connected between ground and one side of four switches located within switch assembly 512. It further comprises four parallel leads 516 connected to the other side of the switch assembly 512. The four leads 516 are connected through 1K resistors to a five volt power supply, and to four input terminals of the up/down counter 504. The switches in switch assembly 512 cooperate with up/down counter 504 to load a signal (binary value) into counter 504 upon receipt of load signal 610 on lead 340 in the same manner as initializing circuit 402 and counter 404 in FIG. 4.

Up/down counter 504 is connected via four parallel output leads 518 to the inputs of D/A converter 506. In the preferred embodiment, converter 506 is a Motorola MC 1406 device which generates and transmits a current signal over lead 519. The level of the current signal varies from zero to −2 milliamps depending on the level of the four bit input signal on leads 518. When the four input signals are all high, converter 506 provides zero milliamps. When the input signals are all low, converter 506 provides a −2 milliamp signal.

It is necessary to convert the current signals provided by the D/A converter to a voltage signal. This is done with the current to voltage converter circuit 508. Current to voltage circuitry 508 comprises an operational amplifier 510, and a feedback circuit including a 3K resistor 514 and a parallel 5 pf roll-off capacitor 515 connected between the output of operational amplifier 510 and its inverting input. The output of D/A converter 506 is provided over lead 513 to the inverting input of operational amplifier 510. The noninverting input is grounded. The current to voltage converter 508 provides a relatively high voltage output signal for a very small current input signal with very little loss to the input current signal. The feedback resistor 514 is shunted by capacitor 516 in order to remove high frequency noise and interference at the output of the operational amplifier 510. Because a negative current signal is applied to the inverting input of the operational amplifier the output of the operational amplifier is a positive voltage signal on lead 548.

The first reference signal from amplifier circuit 408 in FIG. 4 is transmitted via lead 322 through a 5.1K resistor 520 to a summing junction 522. Signals from the photomultiplier tube assembly 132 are also transmitted via lead 326 through the 5.1K resistor 524 to summing junction 522. Summing junction 522 is connected to a National Semiconductor LM318 operational amplifier 526 whose output is fed back through 5.1K feedback resistor 528 to the summing junction 522. The noninverting input terminal of the operational amplifier is grounded through a 1K resistor 529. With this arrangement the negative first reference signal on lead 322 will be added with the positive signals received from the photomultiplier tube assembly on lead 326. The summed signals will appear with unity gain and inverted at the output of operational amplifier 526. The summed output signals are transmitted through a 1K resistor 530 to the second sample and hold circuit 330 comprising a National Semiconductor LF398 sample and hold circuit. A 3000 pf capacitor 533 is connected to ground between the 1K resistor 530 and the input to sample and hold circuit 330. The arrangement of the resistor 530 and capacitor 533 operates to filter out unwanted high frequency noise components present on the output of operational amplifier 526.

The output of sample and hold circuit 330 is connected via lead 536 to a first input terminal of electronic switch 538 which in the preferred embodiment is a National Semiconductor LF 13333 device. The output of operational amplifier 526 is provided directly to a second input terminal of switch 530 via lead 540. During the B time signal 602 provided over lead 542, switch 538 provides the signals present on lead 536 from the second sample circuit 330 to the switch output lead 544 which is connected to its output terminal. At the end of the B signal, the switch 538 switches and provides the signals present in lead 540 to lead 544.

The output of switch 538 on lead 544 is connected to the Y input of a multiplier circuit 546, and the output of current to voltage converter 508 is connected via lead 548 to the X input of multiplier 546. The output of multiplier circuit 546 is provided over lead 548 to the noninverting input terminal of comparator 558. The inverting input terminal is connected to a circuit designated generally 560 which provides a fixed signal with a preselected voltage level. Circuit 560 comprises a −15 volt power supply connected through a 1K resistor 561, a variable 5K resistor 562 and a 6.8 μf capacitor 563 to the inverting input terminal of operational amplifier 558. In the preferred embodiment, circuit 560 provides a −1.9 volt signal to comparator 558. The output of comparator 558 is connected through a 1K resistor 564 to a five volt power supply, and to the D input of a flip flop 566.

Operation of the circuit of FIG. 5 will now be given in connection with the signals of FIG. 6. During the first 20 microseconds of the B time interval, load signal 610 on lead 340 loads the manually selected signal in initializing circuit 502 into the up/down counter 504. This four bit signal is converted to an analog signal by D/A converter 506, converted to a positive voltage signal by circuit 508 and transmitted to the X input terminal of multiplier circuit 546. During the same 20 microseconds, the photomultiplier tube assembly 132 transmits a calibration substrate signal through resistor 524 on line 326 to the summing junction 522. This is a positive voltage signal and is summed with the negative first reference signal on lead 322. The summed signal is inverted with unity gain by operational amplifier 526 and provided to the sample and hold circuit 330. The sample and hold enable signal 606 is applied via lead 332 to the circuit 330 to enable the circuit to form a signal representative of the summed calibration substrate signal. During the latter 20 microseconds of the time interval B, sample and hold circuit 330 transmits the representative sample of the summed calibration substrate signal over line 536 to switching circuit 538. The signal is passed through the switch 538 on line 544 to the Y input of multiplier circuit 546.

Multiplier circuitry 546 multiplies the X input signal (second reference signal on line 548) with the Y input signal (sample of the summed calibrated substrate signal) and divides the product signal by ten. The resultant signal is transmitted via lead 548 to the noninverting input of comparator 558. If this signal has a value greater than 1.9 volts then a positive signal is provided to D flip flop 566. If the resultant signal from multiplier 546 has a value less than 1.9 volts then a ground signal is transmitted to D flip flop 566. Also, during the latter 20 microseconds of the B time interval, the series of up/down counter signals 616 are transmitted as clocking signals to D flip flop 566 on lead 352 and the series of synchronously occurring counter clock signals 618 are transmitted on lead 341 as clocking signals to the up/down counter 504.

Each time D flip flop 566 is clocked, either a high or low correction signal is transmitted via lead 568 to the up/down input of counter 504. In response to a counter clock signal, the counter incrementally increases or decreases (depending on the state of the correction signal) the value of the four bit signal stored within counter 504. The new digital value, either higher or lower, is converted to analog, inverted to a positive voltage signal, and provided to the X input of multiplier 546 where it is multiplied with the sample of the summed calibration substrate signal from sample and hold circuit 330. Multiplier circuit 546 provides a new input, having a value either greater or lesser than 1.9 volts, to comparator 558. This provides a new input, either positive or negative, to D flip flop 556. The above process repeats with the occurrence of each new up/down counter signal and counter clock signal, respectively. Eventually, the level of the second reference signal appearing at the output of amplifier 510 is adjusted in such a way that the multiplier output 548 equals, within the quantization error, the preset signal on the inverting input of comparator 558.

At the end of the B time interval (signal 602), several things happen. Adjustment of the level of the second reference signal ceases and the value of the second reference signal becomes fixed. The trailing edge of the B signal 602 clears flip flop 566. The laser beam begins scanning the pattern of conductors on the substrate and the photomultiplier tube assembly 132 provides both conductor and substrate signals to the summing junction 522 whereat the conductor and substrate signals are summed with the fixed value first reference signal. If a conductor signal is present in junction 522 then it combines with the first reference signal of near equal value and opposite polarity to provide a near zero signal. If a substrate signal is provided at junction 522 then it is summed with the first reference signal to produce non-zero signals. The summed conductor and substrate signals are transmitted via lead 540 through switch 538, over lead 544, to Y input of multiplier circuit 546. As the signal B goes low, switch 538 passes signals present on line 540 instead of the signals on line 536 from the sample and hold circuit 532.

Since the photomultiplier assembly 132 produces both conductor and substrate signals during the laser scan of the conductor pattern both summed conductor and summed substrate signals are applied to multiplier circuit input terminal Y. Hence, both summed conductor and summed substrate signals are multiplied by the fixed value second reference signal. However, when near zero summed conductor signals are applied to multiplier circuit 546 the resultant signal is still near zero since the near zero value summed conductor signals are multiplied by the value of the second reference signal divided by 10. When a summed substrate signal is present, circuitry 546 provides a product signal which, in the present example, is close in value to −1.9 volts which is the level of the voltage provided to the inverted input of comparator 558. Other constant substrate voltages could be obtained by altering the preset signal on the inverting input of comparator 558. These adjusted conductor and substrate output signals are transmitted over lead 570 to a digitizing circuit designated generally 572 and an automatic error detection circuit designated generally 574.

If a different circuit board is now placed in the scanning apparatus 100, the circuit of the present invention will once again adjust the first reference signal to match the conducting signal of the new circuit board; adjust the second reference signal to match the summed substrate signal for the circuit board; and provide adjusted conductor signals which are near zero and adjusted substrate signals at −1.9 volt levels. Regardless of the level of return of the conductor and substrate signals for a given printed circuit board (within the limits of adjustment of the up/down counters 404 and 504), the circuit of the present invention, in the present example, provides near zero and near −1.9 volt signals representative of conductor and substrate signals respectively.

Digitizing circuit 572 comprises a comparator 576 with a constant preselected threshold voltage provided to the noninverting input. The adjusted output signals from multiplier circuit 546 are provided to the inverting input. In the preferred embodiment, the threshold voltage level is 0.8 to 0.9 volts. If an adjusted output signal is near zero the amplifier 576 will provide a logic low signal to the pair of serially connected inverters 578 and 580. If the summed output signal is −1.9 volts then the amplifier 576 will provide a logic high signal to the inverter pair. The resultant digitized high and low binary signals are transmitted via lead 590 to a preprocessing circuit where the binary signals are operated on to eliminate digitizing errors and known errors occurring in the scanning apparatus. Hence, for all printed circuit boards tested, the circuit of the present invention provides low logic level signals for conductors and high logic level signals for substrate.

It may be possible that the levels of substrate signals deviate so far from the expected levels that the second reference signal can not be adjusted to provide the required product signal from multiplier circuit 546. If this is the case then it is not desirable to continue inspection of the printed circuit board. Circuit 574 functions to alert the operator of the scanning apparatus that proper adjustment by the circuit of the product signals was not accomplished. The product signal of the multiplier circuit 546 is provided over lead 570 to the noninverting input of comparator 582. A −1.55 volt signal is provided to the inverting input. During the last 20 microseconds of time interval B the product signal should approximate −1.9 volts which exceeds the −1.55 volt at the inverting signal terminal. If it does exceed −1.55 volts, a ground voltage signal will be provided to AND gate 584. However, if it does not exceed −1.55 volts then the comparator 582 will invert the −1.55 volt providing a high logic signal to AND gate 584. At the end of the B time interval, after the signals 616 and 618, a high enable signal 622 is transmitted from control signal generator 304 via lead 586 to AND gate 584. If a high signal from amplifier 582 is present at AND gate 584 at that time, an error signal is generated on lead 592 to stop inspection of the printed circuit board.

While the present invention has been disclosed in connection with the preferred embodiment thereof, it should be understood that there may be other embodiments which fall within the spirit and scope of the invention as defined by the following claims.

What is claimed is:

1. In a scanning apparatus which periodically sweeps a beam of light across a printed circuit board along a plurality of sweep paths, and said scanning apparatus including detector means responsive to radiation from the printed circuit board as it is swept by said beam of light for producing first and second signals indicative of whether a conductor portion or a substrate portion of said printed circuit board is being swept, the improvement comprising:
   automatic level control means responsive to said first and second signals for providing level adjusted first and second output signals, the levels of said level adjusted second output signals being substantially the same for all printed circuit boards swept in said scanning apparatus.

2. The improvement as claimed in claim 1 wherein said automatic level control means comprises:
   a first circuit means responsive to said first and second signals for producing summed first and second signals, said summed first signals having a signal level which is substantially zero, said first circuit means further comprising:
   first reference circuit responsive to at least one of said first signals for automatically producing a first reference signal with a signal level substantially equal to said at least one of said first signals; and
   summing means responsive to said first and second signals and said first reference signal for summing said first and second signals with said first reference signal to produce said summed first and second signals.

3. The improvement as claimed in claim 2 wherein said automatic level control means further comprising:
   a second circuit means responsive to said summed first and second signals for producing said level adjusted first and second output signals, the level of said level adjusted first output signals being substantially zero and the level of said level adjusted second output signals being substantially equal to a preselected signal level.

4. The improvement as claimed in claim 2 wherein said first reference circuit comprises:
   first reference signal means for generating said first reference signal having an initial signal level;
   first sampling means responsive to said at least one of said first signals for generating a first sample signal having a signal level substantially equal to said at least one of said first signals during a first time interval when only said at least one of said first signals is being produced by said detector means; and
   first comparator means responsive to said first reference signal and said first sample signal and coupled to said first reference signal means for generating and transmitting correction signals to said first reference signal means for changing the initial level of said first reference signal during said first time interval.

5. The improvement as claimed in claim 4 wherein said first reference signal means comprises:

first up/down counter means for initially storing a first initial signal having a first signal level and for increasing or decreasing the level of said first initial signal in response to said correction signals from said first comparator means.

6. The improvement as claimed in claim 3 wherein said second circuit means further comprises:
second reference circuit for producing a second reference signal; and
operating circuit responsive to said summed first and second signals and said second reference signal for producing said level adjusted first and second output signals.

7. The improvement as claimed in claim 6 wherein said second reference circuit comprises:
second reference signal means for generating said second reference signal having an initial signal level;
second sampling means responsive to at least one of said summed second signals for generating a second sample signal having a signal level substantially equal to said at least one of said summed second signals during a second time interval when only said at least one of said summed second signals is being produced by said detector means, said operating circuit responsive to said second sample signal and said second reference signal for producing intermediate level second output signals during said second time interval; and
second comparator means responsive to said intermediate level second output signals of said operating circuit and to a fixed voltage signal having said preselected signal level for generating and transmitting correction signals to said second reference means for changing the initial level of said second reference signal during said second time interval whereby when said operating circuit operates on said second reference signal and said summed first and second signals after said second time interval said automatic level control means produces said level adjusted first and second output signals.

8. The improvement as claimed in claim 7 wherein said second reference signal means comprises:
second up/down counter means for initially storing a second initial signal having a second signal level and for increasing or decreasing the level of said second initial signal in response to said correction signals from said second comparator means.

9. The improvement as claimed in claim 6 wherein said operating circuit comprises:
a multiplier means for multiplying said summed first and second signals by said second reference signal and dividing the product by a predetermined number to generate said level adjusted first and second output signals.

10. The improvement as claimed in claim 9 wherein said multiplier means is connected to receive said second reference signal for generating said intermediate level second output signals.

11. The improvement as claimed in claim 4 wherein said printed circuit board comprises first and second calibration areas and at least one of said first signals is produced by said detector means when said beam of light sweeps across said first calibration area of said printed circuit board.

12. The improvement as claimed in claim 11 wherein said at least one of said summed second signals is produced by said detector means when said beam of light sweeps across said second calibration area of said printed circuit board.

13. The improvement as claimed in claim 1 wherein said first signals are produced in response to reflection of said beam of light from conducting portions of said printed circuit board and said second signals are produced in response to florescense of said substrate portion of said printed circuit board when said beam of light is incident thereon.

14. The method of providing level adjusted first and second output signals in response to first and second signals generated in a scanning apparatus which periodically sweeps a beam of light across a printed circuit board along a plurality of sweep paths, said scanning apparatus including detector means responsive to radiation from the printed circuit board as it is swept by said beam of light for producing first and second signals indicative of whether a conductor portion or a substrate portion of said printed circuit board is being swept, the method comprising the steps of:
generating automatically a first reference signal having a signal level substantially equal to said first signal;
summing said first reference signal with said first and second signals to produce summed first and second signals, said summed first signals having a signal level substantially equal to zero;
generating a second reference signal;
operating on said reference signal and said summed first and second signals to produce level adjusted first and second output signals, said level adjusted first output signals having a signal level substantially equal to zero and said level adjusted second output signals having a signal level substantially equal to a preselected signal level.

15. The method as claimed in claim 14 wherein the step of generating automatically a first reference signal comprises:
generating a first reference signal having an initial signal level;
forming a sample signal of said first signals during a first time interval when only said first signals are being transmitted, said sample signal having a signal level substantially equal to the signal level of said first signals;
comparing the value of said first sample signal and said first reference signal to generate first correction signals therefrom; and
changing the value of said first reference signal during said first time interval in response to said first correction signals whereby the level of said first reference signal is made substantially equal to the level of said first signals.

16. The method as claimed in claim 14 or 15 wherein the step of generating a second reference signal comprises:
generating a second reference signal having an initial signal level;
forming a second sample signal of said summed second signals during a second time interval when only said second signals are being produced;
operating on said second sample signal and said second reference signal to produce an intermediate level second output signal;
comparing said intermediate level second output signal with a preselected signal level to generate second correction signals; and changing the level of said second reference signal in response to said second correction signals.

17. The method as claimed in claim 14 wherein the step of operating on said second reference signal and said summed first and second signals comprises multiplying said first and second signals by said reference signal and dividing the product by a predetermined number.

18. The method as claimed in claim 16 wherein the step of operating on said second sample signal and said second reference signal comprises multiplying said second sample signal by said second reference signal and dividing the product by a predetermined number.

19. The method as claimed in claim 14 further comprising the step of:
forming first and second calibration portions on said printed circuit boards such that said beam of light sweeps across said first calibration portion during said first time interval and sweeps across said second calibration portion during said second time interval.

* * * * *